United States Patent
Chen et al.

(10) Patent No.: US 6,680,252 B2
(45) Date of Patent: Jan. 20, 2004

(54) METHOD FOR PLANARIZING BARC LAYER IN DUAL DAMASCENE PROCESS

(75) Inventors: Anseime Chen, Hsin-Chu (TW); Hui-Ling Huang, Hsin-Chu (TW); Vencent Chang, Taipei (TW); Andersen Chang, Miao-Li (TW)

(73) Assignee: United Microelectronics Corp., Hsin-Chu (TW)

( * ) Notice: Subject to any disclaimer, the term of this patent is extended or adjusted under 35 U.S.C. 154(b) by 121 days.

(21) Appl. No.: 09/854,966

(22) Filed: May 15, 2001

(65) Prior Publication Data

US 2002/0173152 A1 Nov. 21, 2002

(51) Int. Cl.[7] .............................................. H01L 21/302
(52) U.S. Cl. ........................................ 438/691; 438/692
(58) Field of Search ......................... 438/700, 690–693, 438/720, 723, 724, 725

(56) References Cited

U.S. PATENT DOCUMENTS

| | | | | |
|---|---|---|---|---|
| 3,935,330 A | * | 1/1976 | Smith et al. ................ | 427/487 |
| 5,939,236 A | * | 8/1999 | Pavelchek et al. ........ | 430/273.1 |
| 6,187,661 B1 | * | 2/2001 | Lou ........................... | 438/622 |
| 6,319,821 B1 | * | 11/2001 | Liu et al. .................... | 438/636 |
| 6,455,416 B1 | * | 9/2002 | Subramanian et al. ...... | 438/636 |

* cited by examiner

Primary Examiner—Kin-Chan Chen
(74) Attorney, Agent, or Firm—Dickinson Wright PLLC

(57) ABSTRACT

The present invention is directed to a method for planarizing BARC layer in dual damascene process. For forming a dual damascene interconnect structure, by use of the present invention, a planar topography of the BARC layer is achieved by chemical mechanical polishing. The present invention applies a low temperature to bake the coated BARC layer before BARC material cross-links and induces the anti-reflective characteristic. Then, the BARC layer is planarized by chemical mechanical polishing. Next, a high temperature baking of the BARC layer is provided before coating the photoresist, so formation of the BARC layer is controlled with minimized variation in surface level and has the antireflective characteristic. Thus, the profile distortion on the via and the critical dimension control for the via are improved by patterning the via on a planar and an anti-reflective surface.

19 Claims, 8 Drawing Sheets

METHOD FOR PLANARIZING BARC LAYER IN DUAL DAMASCENE PROCESS

BACKGROUND OF THE INVENTION

1. Field of the Invention

The present invention generally relates to a method for planarizing bottom-anti-reflective coating (BARC) layer, and more particularly to a method for forming dual damascene structure with improved critical dimension (CD) control for vias by planarizing the BARC layer.

2. Description of the Prior Art

As feature sizes shrink, more devices can be built per unit substrate area. The multi-layer interconnects are employed in order to accommodate higher densities as device dimensions shrink well below one micron design rules. Through advanced semiconductor processing techniques, integrated circuit devices with sub-micron and sub-half-micron features have driven the need for multi-layer interconnects. At the same time, the size of interconnect structures will also need to shrink, in order to accommodate the smaller dimensions. Thus, as integrated circuit technology advances into the deep sub-micron range, more advanced interconnect architecture and application are required.

The damascene integration scheme is one such architecture to satisfy this need. There are two major classes of damascene processes: single-damascene and dual-damascene. A single damascene process involves making contact to a lower conductive layer by patterning dielectric layer and forming a conducting plug in the dielectric layer, then patterning a second dielectric layer and forming the actual interconnect wiring metallization in the dielectric layer. The dual damascene technology is applied, as integrated circuit technology advances to 0.18 micrometer. In a dual damascene process, the interconnect wiring and plug are formed by patterning both the via and the trench patterns into dielectric layer, then filling them simultaneously with conducting material, such as metal. The dual damascene process offers advantages in process simplification and low manufacturing cost by reducing the process steps required to form the vias and trenches for a given metallization level. The openings, for the wiring of a metallization level and the underlying via connecting the wiring to a lower conducting level, are formed at the same time.

Dual damascene integration requires challenging developments of patterning processes. Both lithography and etch become more difficult due to the complex layer stack and intermediate topography. Therefore, many different dual damascene patterning strategies are possible, leading to a similar topography before the conducting material is placed. Many dual damascene process flows depend upon the sequence of basic etch steps, which defines a dual damascene process flow as self-aligned, via-first, or trench-first. Self-aligned dual damascene (SADD) needs a thick intermediate layer to serve as a photo anti-reflection layer, an etch-stop layer, and a hard mask providing CD control for underlying vias. Because self-aligned vias require almost perfect trench-to-via alignment and the challenge of maintaining a very high selectivity between the dielectric and intermediate stop layer when etching the via, its application is limited. In the via-first dual damascene (VFDD), the via lithography is done first on top of the full stack. After via etching and stripping, the trench photo step is done. In some cases, the bottom of via is covered by organic material to protect the via during the trench etch. In the approach of trench-first dual damascene (TFDD), the trench is masked and etched through the dielectric layer with stop at a timed depth. The via pattern is then aligned with trench and etched through the dielectric layer to the lower conductive layer. The second via lithography process is much more challenging, due to the topography variations, since a variety of trench feature widths and pitches are possible, and achieving a uniform trench with a smooth flat etch front is difficult.

It is well known that reflection control is essential in lithography processing. Unwanted reflections from these underlying materials during the photoresist patterning process cause the resulting photoresist pattern to be distorted. The use of an anti-reflective coating (ARC) is pursued in the integration of dual damascene to prevent distortion of the photoresist pattern. However, as creating topography in the first lithography step, local reflectivity changes occur over the substrate. The use of a single layer resist on this topography results in severe CD variations. This is not only the result of these local reflectivity variations, but also of the severe resist thickness variations, due to changes in feature topography density. A possible solution is the use of an organic bottom-anti-reflective coating (BARC), which helps on one hand to make the reflectivity again more uniform, but on the other hand helps to decrease the step height in topography.

However, in the TFDD or VFDD process, without using a gap-filling material after the first patterning step, this results in profile distortion due to the rough topography. It is noted that, in some cases, the gap-filling process in VFDD creates a fence problem, which is a residue when the trench is etched. Another approach with partial gap-filling still cannot prevent the profile distortion, because it is difficult to predict how planarization is required in a process, since partial filled BARC already reduce reflectivity changes and resist thickness swing. Therefore, in most cases, all possible feature densities are completely filled with BARC material. In the conventional technique, this requires planarizing BARC with lower viscosity or multiple coating of planarizing BARC. That is to say, the planarization is very important for the second lithography process in dual damascene patterning, profile distortion occurs if there is no further planarization on coated BARC. As shown in FIG. 1, the profile of a via pattern transferred photoresist 18 formed on a rough BARC surface 16 which fills the trench in the dielectric layer 14 on a substrate 10 having a conductive structure 12 is distortion. The main issue of planarization on the first created topography is that all sizes are possible in combination with all pitches. This means that in principle a minimum size isolated feature can be present as well as a minimum spacing between very large features. Referring to FIG. 2, showing a dielectric layer 24 with trenches is formed on a substrate 20 having conductive structures 22 by using BARC 26 as the gap-filling material, a rough topography is presented. Filling both isolated and dense features in a similar way is very difficult. The BARC coating level is very different depending very much on the feature density and size.

Besides, investigation on planarization of BARC level has disclosed that after coated BARC material cross-linking to achieve the goal of anti-reflecting, it is difficult to further planarize the BARC level to get smoother topography due to its hardness. Thus, during implanting dual damascene process, it is desired to get planar topography prior to executing the second lithography process to improve the profile distortion and the CD control for vias because of poor film topography and different thickness variation in BARC layer.

SUMMARY OF THE INVENTION

The present invention is directed to a method for planarizing a BARC layer in the dual damascene process. For forming dual damascene interconnect structure, by use of the present invention, a planar topography of BARC layer is achieved by chemical mechanical polishing. The essential part of the present invention is to apply low temperature baking of the coated BARC layer before BARC material cross-links and induces the anti-reflective characteristics. Then, the BARC layer is planarized by chemical mechanical polishing. A high temperature baking of the BARC layer is provided before coating the photoresist, so the BARC layer is controlled with minimized variation in surface level and has the anti-reflective characteristic. Thus, the profile distortion on via and the CD control for via are improved by patterning via on a planar surface with anti-reflective characteristic.

It is another object of this invention that a method for chemical mechanical polishing BARC layer is provided.

It is a further object of this invention that a method for improving the CD control for vias by performing via lithography on a planar BARC surface in dual damascene process is provided.

It is another further object of this invention that a method for reducing the fence effect by preventing photoresist from reacting with dielectric film of low k material in the opening of forming the dual damascene structure is provided.

In accordance with the present invention, in one embodiment, a method for forming dual damascene interconnect structure with improved CD control for vias by planarizing BARC layer is disclosed. The method comprises a step of providing a substrate having a conductive structure. Then, a dielectric layer is formed on the substrate. A first patterned photoresist defining a first opening is formed on the dielectric layer. Then, by using the first patterned photoresist as a mask a portion of the dielectric layer is etched to a first depth. Next, the first patterned photoresist is removed. Then, a bottom-anti-reflective coating (BARC) layer is formed on the dielectric layer and the first opening is filled with the bottom-anti-reflective coating. Then, the BARC layer is baked at a first temperature, such that the BARC layer is soft enough to be planarized. Next, the BARC layer is chemical mechanical polished to expose the dielectric layer. Then, the BARC layer is baked at a second temperature to have antireflective ability. A second patterned photoresist defines a second opening is formed on the dielectric layer. Then, the BARC layer and the dielectric layer are etched to expose the conductive structure of the substrate by using the second photoresist as a mask. Next, the second patterned photoresist and the BARC layer are removed. Then, the first opening and the second opening are filled with a conductive material to form a conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Figure 1:
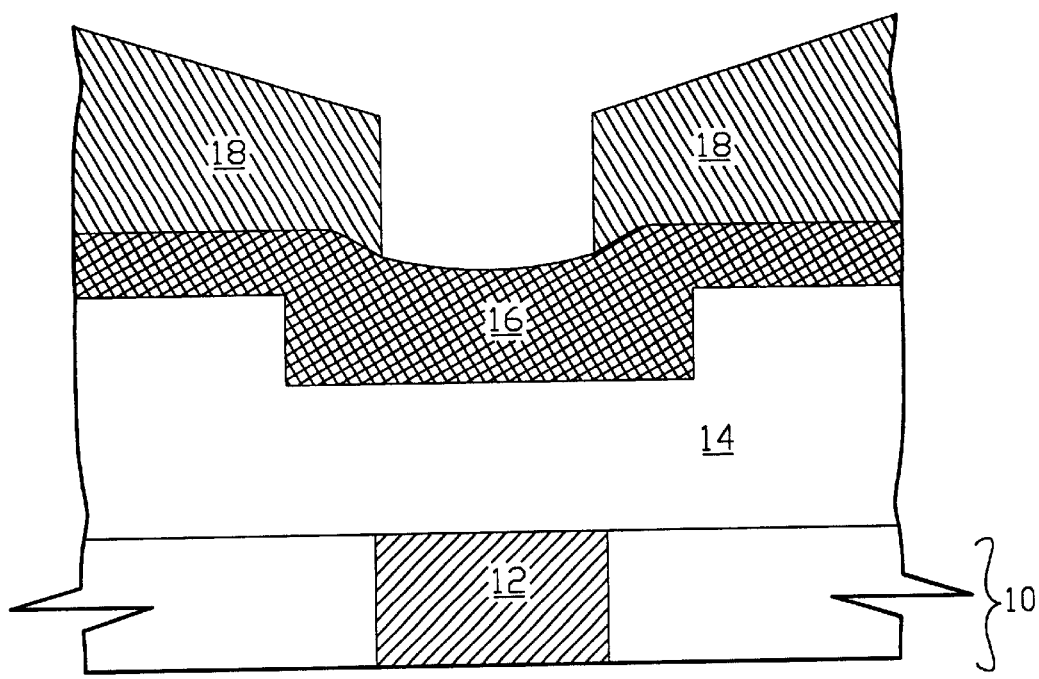
FIG. 1 is a schematic cross-section view of the profile distortion of patterning on the conventional coated BARC layer.
Figure 2:
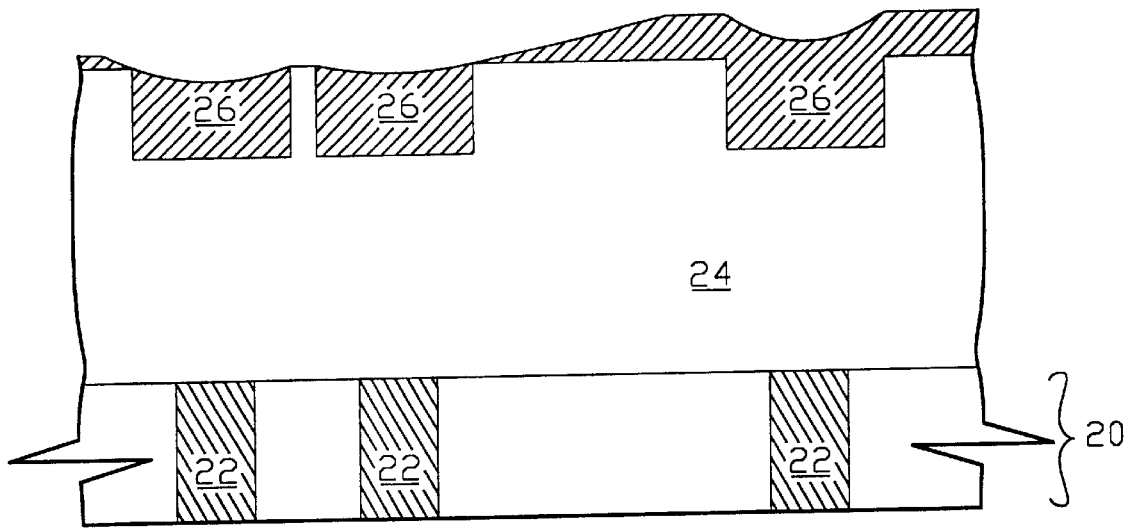
FIG. 2 is a schematic cross-sectional view of the coated BARC level on isolated/dense trench areas in the prior art.
Figure 3A:
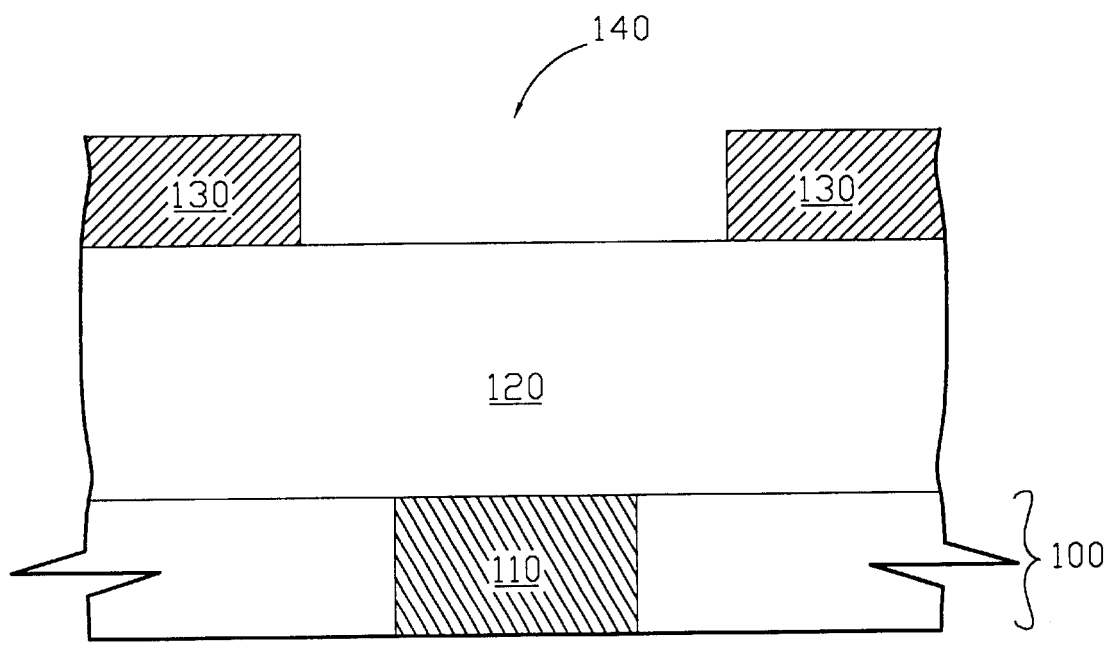
FIGS. 3A to 3E are schematic cross-sectional views of forming a dual damascene structure in one embodiment in accordance with the present invention.

Referring to FIG. 3A, in one embodiment, the method for forming a dual damascene interconnect structure is disclosed. The method comprises a step of providing a substrate 100 having a conductive structure 110. The substrate 100 includes any suitable semiconductor material at any device processing stage that needs an interconnection. The conductive structure 110 is any structure to which an electrical contact is desired, such as a metal line. A dielectric layer 120, such as a low k material layer comprising FSG, Coral, and Flare, is formed on the substrate 100. The low k material layer may be formed by a spin on technique. Then, a first patterned photoresist 130 is formed on the dielectric layer 120, wherein the first patterned photoresist 130 defines a first contact opening 140. The first contact openings can be either a trench or a via opening, for example a trench opening described here. By use of the first patterned photoresist 130 as a mask, a portion of the dielectric layer 120 is etched to a first depth. The dielectric layer 120 at the trench opening 140 is anisotropically etched. The first patterned photoresist 130 serves as an etch barrier during etching, which is timed for the first depth usually a predetermined depth, such as half the thickness of the dielectric layer 120. Then, the first patterned photoresist 130 is removed.

Figure 3B:
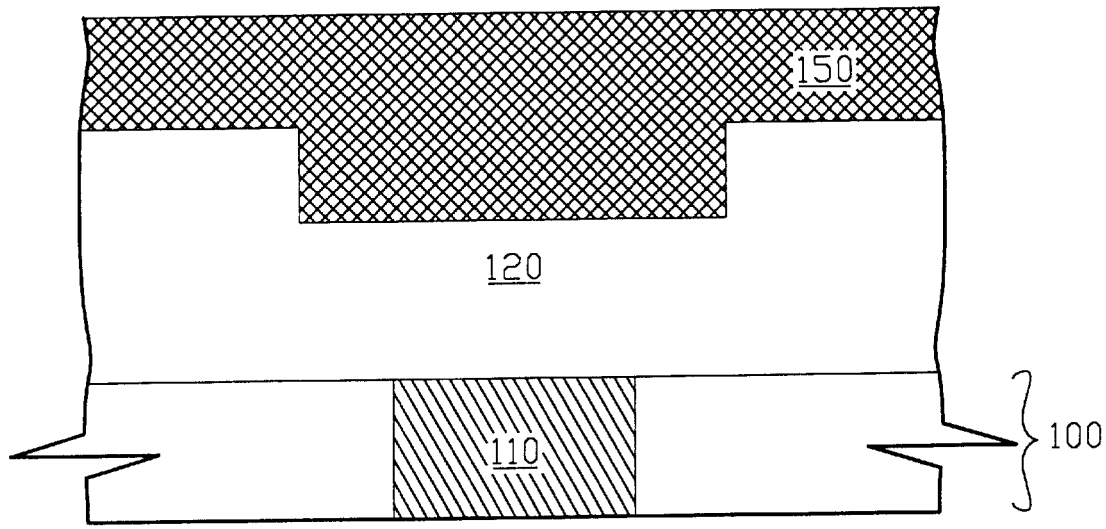

A layer of gap-filling material 150, such as an organic BARC material, is formed on the dielectric layer 120 to fully fill the trench opening 140, as shown in FIG. 3B. The essential part of the present invention is to apply low temperature baking to the coated BARC layer before the BARC material cross-links and induces the anti-reflective characteristic. Then, the BARC layer is planarized by chemical mechanical polishing. A high temperature baking of BARC is provided before coating the photoresist, so the BARC layer is controlled with minimized variation in the surface level and has the anti-reflective characteristic. The coated BARC layer on the dielectric layer is baked at a first temperature. The first temperature is any temperature that will not make the BARC material too hard to be further planarized due to the cross-linking behavior of BARC material which activates the antireflective characteristic, such as about 80° C. to 120° C., or at 90° C. in the embodiment. Next, the BARC layer 150 is planarized to expose the dielectric layer 120. Lacking of the cross-linking behavior, the BARC layer 150 is soft enough to be planarized by chemical mechanical polishing. Then, the coated BARC layer 150 on the dielectric layer is baked at a second temperature. The second temperature is any temperature that can make the BARC layer cross-link to activate the anti-reflective characteristic of BARC materials, such as about above 160° C., or at 180° C. in the embodiment. The BARC materials, after being baked by the second temperature, can be either opaque or translucent, and yet not reflect, nor transmit electromagnetic radiation.

Figure 3C:
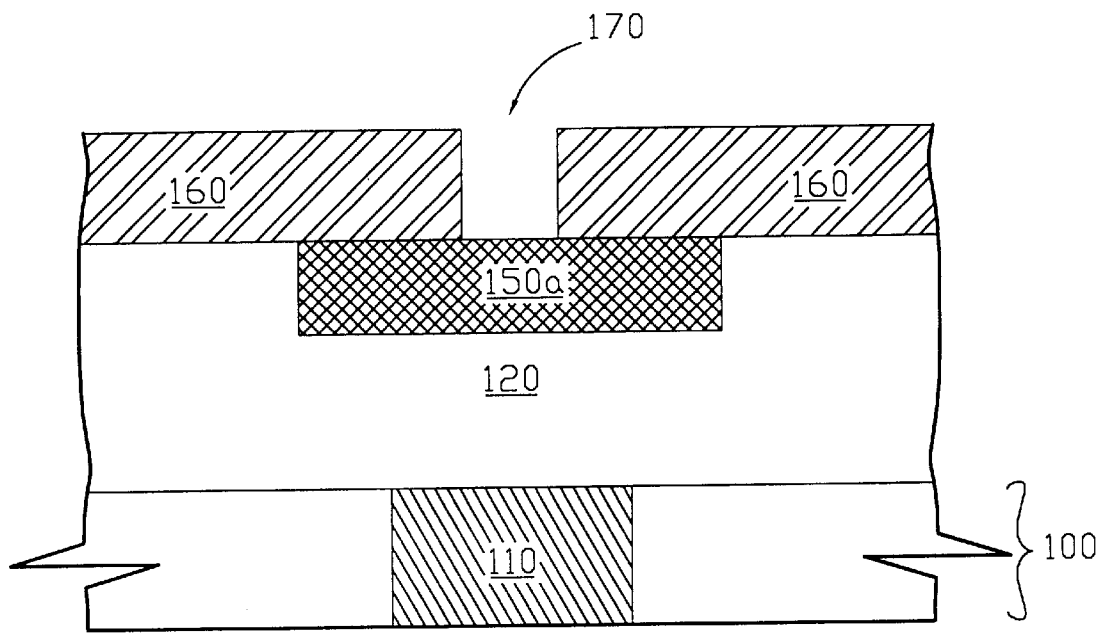
Figure 3D:
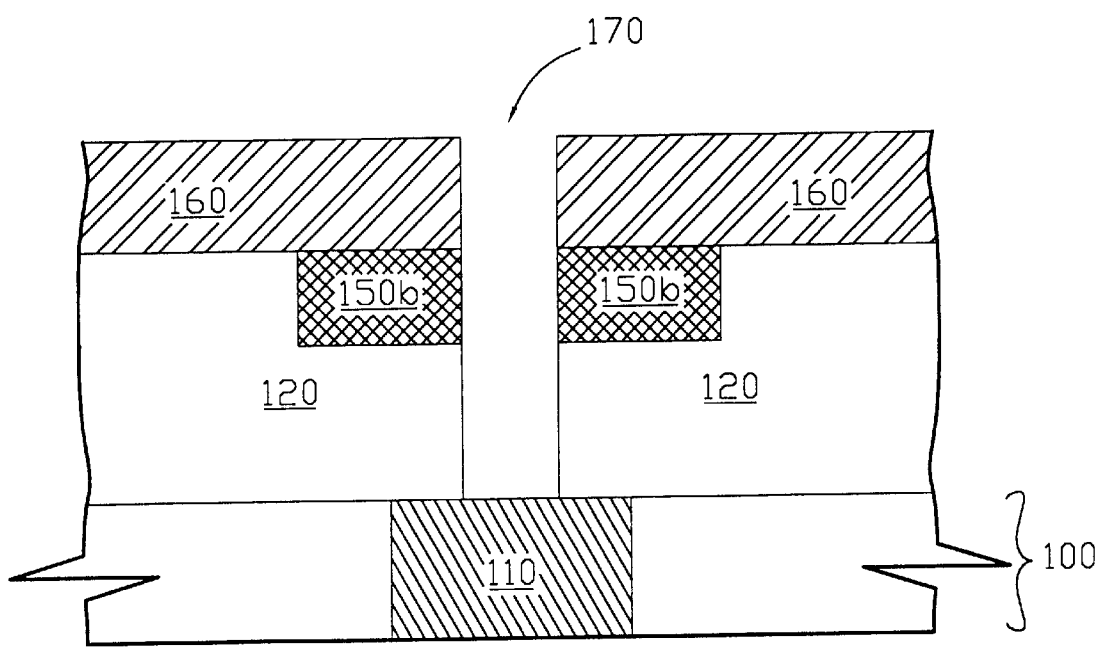
Figure 3E:
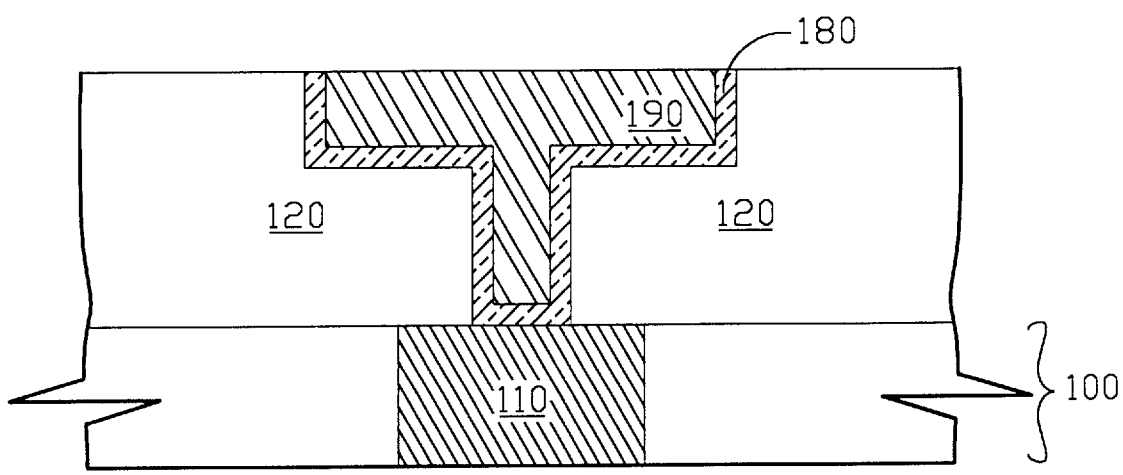

Then, a second patterned photoresist 160 is formed on the dielectric layer 120 with the planarized BARC structure 150a. The second patterned photoresist 160 defines a second contact opening 170, a via opening in this case, as shown in FIG. 3C. Referring to FIG. 3D, by use of the second patterned photoresist 160 as a mask, the planarized BARC layer 150a and the lower half dielectric layer 120 are etched to expose the conductive structure 110 of the substrate 100. Thus, the via lithography is done on a planar surface, regardless of the fact that the control for resolution or critical dimension can be well improved. Then, the second patterned photoresist 160 and the remaining BARC layer 150b are removed. The second patterned photoresist 160 can be removed by a conventional technique such as ashing in an oxygen ($O_2$) plasma. The BARC layer 150b can be removed by either a wet etch or a dry etch. Then, by filling the trench and via with conducting materials, such as metal, the interconnection is formed. For example, an optional barrier layer 180 and a conductive layer 190 are deposited over the substrate 100. Thus, a dual damascene interconnect structure is formed, as shown in FIG. 3E. The barrier layer serves as a diffusion barrier preventing materials in the conductive layer from diffusing into the dielectric layer.

Figure 4A:
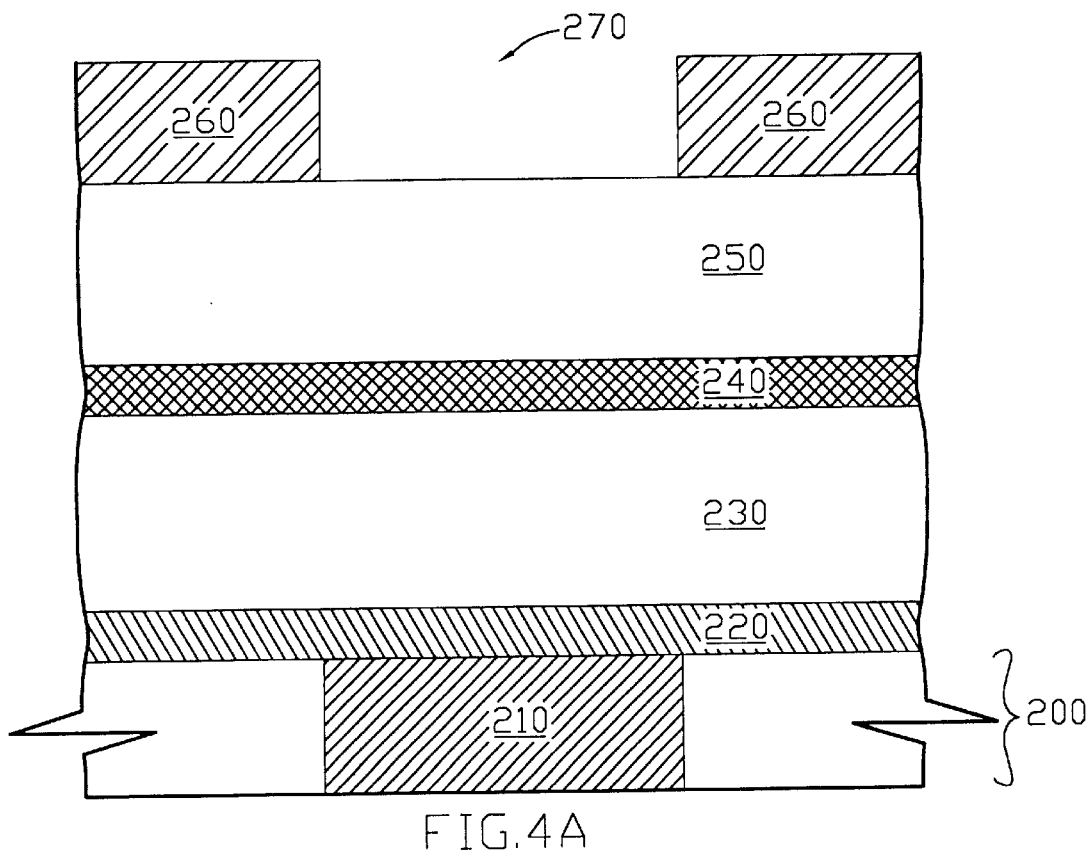
FIGS. 4A to 4G are schematic cross-sectional views of forming a dual damascene structure in another embodiment in accordance with the present invention.

The present invention can also be applied to any manufacture for fabricating interconnects using a dual damascene process which incorporates a low k dielectric material, high conductivity metal, any hard mask scheme, such as dual hard masks, or more complex structure with several etching stop layers. In another embodiment, referring to FIG. 4A, the method for forming a dual damascene interconnect structure is disclosed. The method comprises a step of providing a substrate 200 having a conductive structure 210. The substrate 200 includes any suitable semiconductor material at any device processing stage that needs an interconnection. The conductive structure 210 is any structure to which an electrical contact is desired, such as a metal line. Then, a cap layer 220, such as a silicon nitride layer, is formed on the substrate 200 to serve the purpose of preventing the diffusion of metal into the overlying structures. Next, a first dielectric layer 230, such as low k material layer, is formed on the nitride cap layer 220, which is followed by a etch-stop layer 240 to act as an etching stop during the trench etch. Then, a second dielectric layer 250 is formed on the etch-stop layer 240.

Figure 4B:
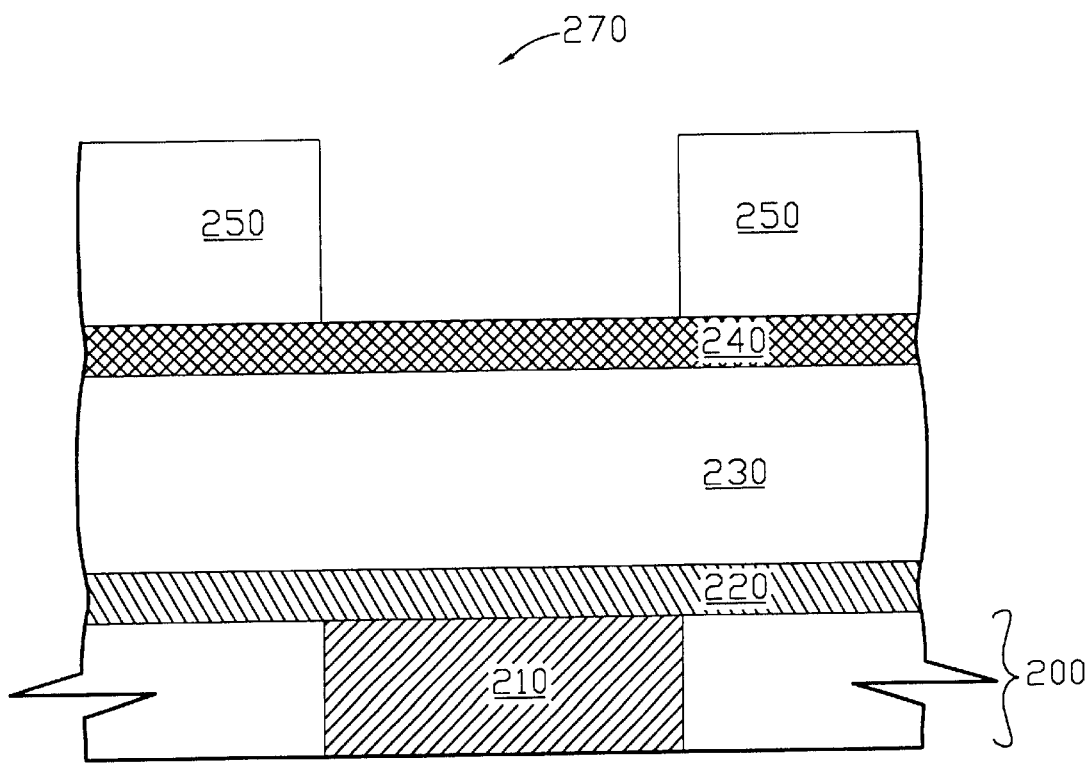
Figure 4C:
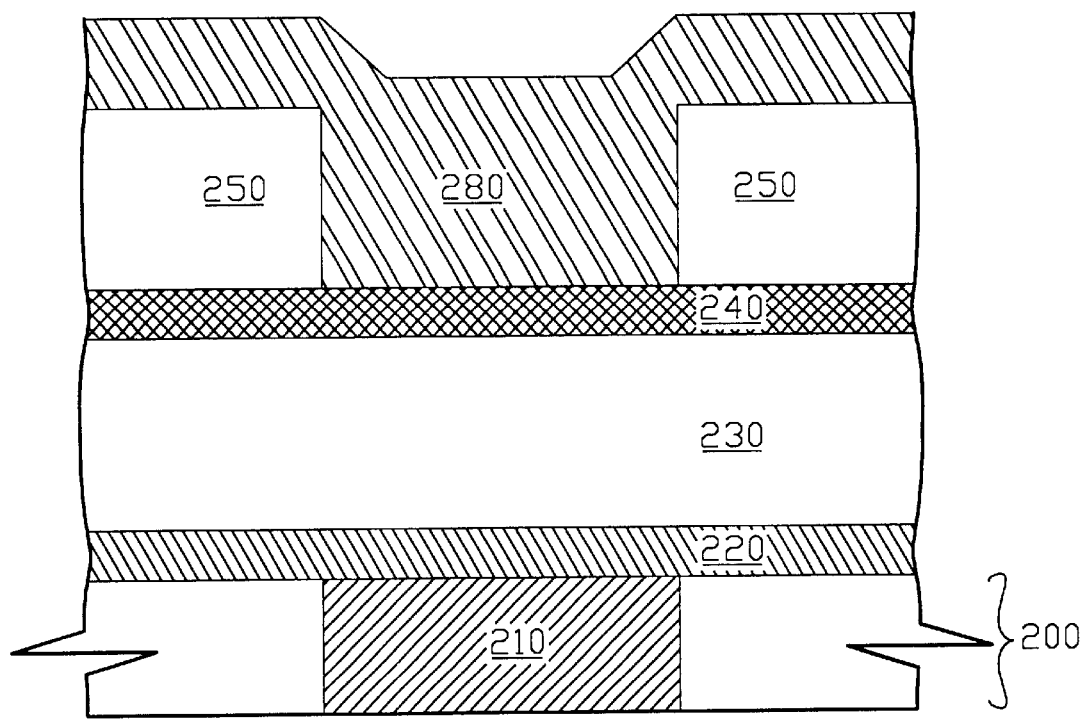
Figure 4D:
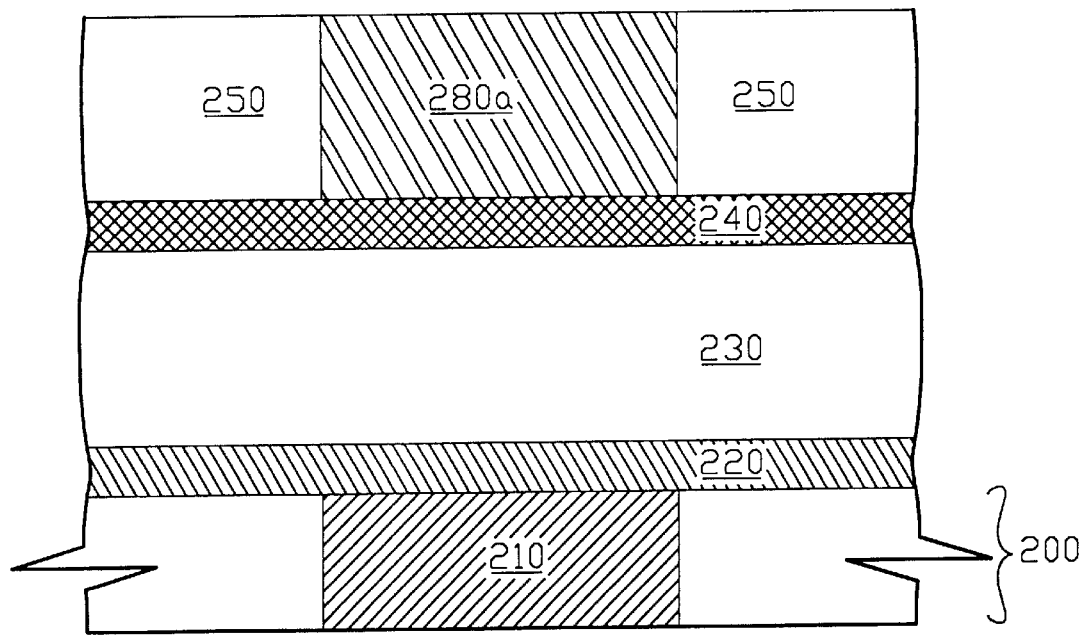

Then, a first patterned photoresist 260 is formed on the second dielectric layer 250, wherein the first patterned photoresist 260 defines a first contact opening 270. The first contact openings can be either a trench or a via opening, for example a trench opening described here. By use of the first patterned photoresist 260 as a mask, a portion of the dielectric layer 250 is etched to expose the etch-stop layer 240. After the trench opening 270 is formed, the first patterned photoresist 260 is removed, as shown in FIG. 4B. Then, a layer of gap-filling material 280 is formed on the etch-stop layer 240 to fully fill the trench opening 270, as shown in FIG. 4C. The gap-filling material can be an anti-reflective material which is soft at a temperature to be planarized by chemical mechanical polishing, such as BARC materials. The coated BARC layer 280 on the second dielectric layer is baked at a first temperature. The first temperature is any temperature that will not make the BARC layer too hard to be further planarized due to the cross-linking behavior of BARC material, such as about 90° C. or 100° C. Next, the BARC layer 280 is planarized to expose the second dielectric layer 250. Lacking the cross-linking behavior, the BARC layer 280 is soft enough to be planarized by chemical mechanical polishing. Then, the coated BARC layer on the dielectric layer is baked at a second temperature. The second temperature is any temperature that can make the BARC layer cross-link to have the anti-reflective ability, such as about 180° C. After baking at the low temperature followed by planarization and baking at the high temperature, the BARC layer has planar topography and a characteristic of anti-reflectivity, as shown in FIG. 4D.

Figure 4E:
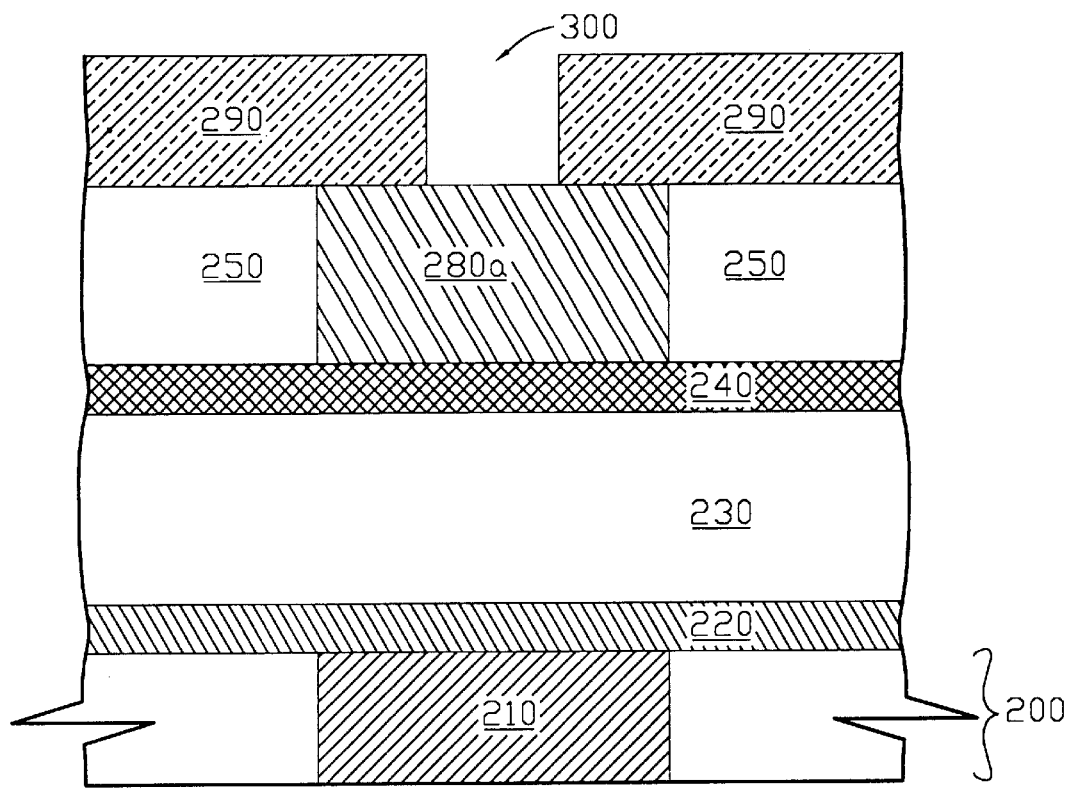
Figure 4F:
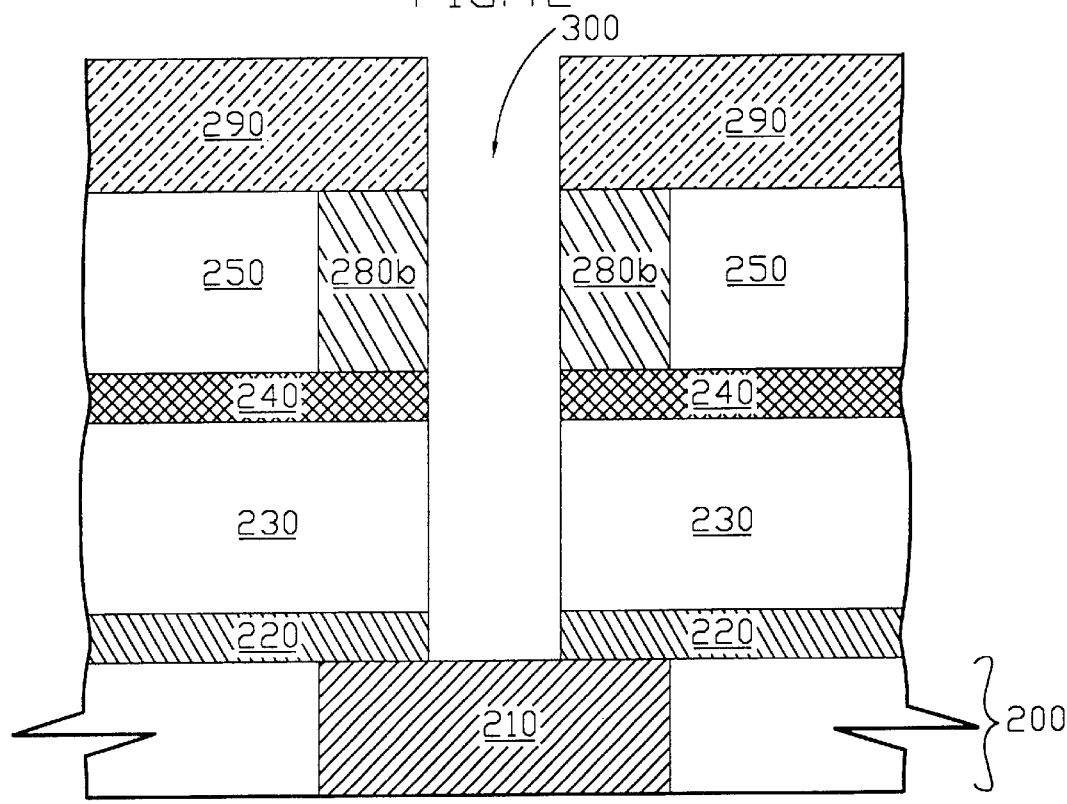
Figure 4G:
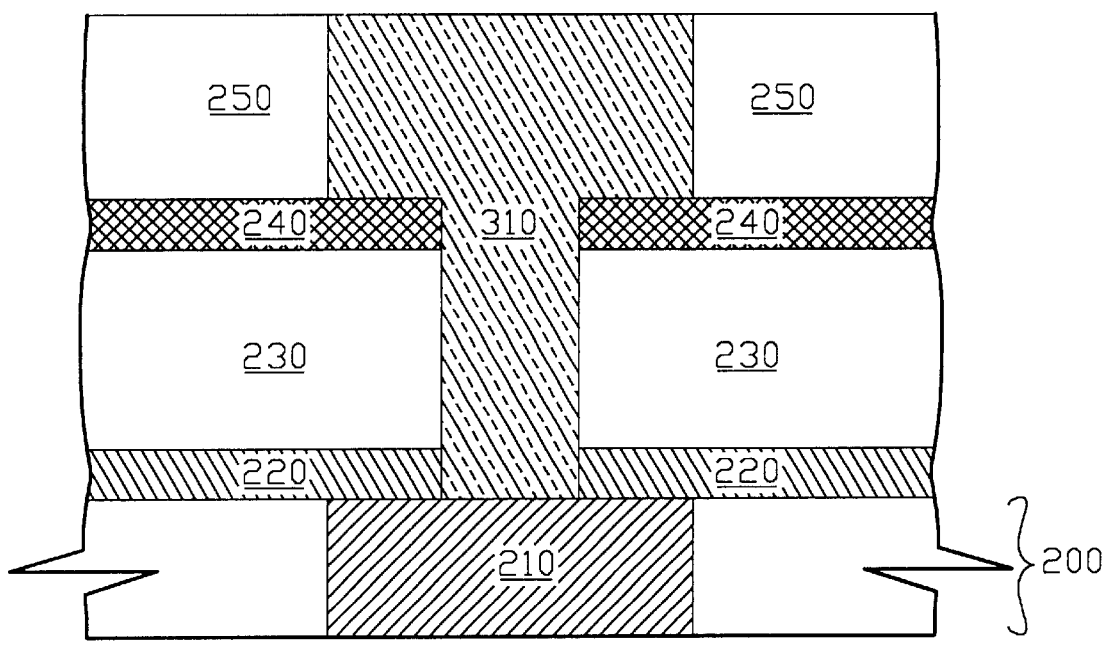

Next, a second patterned photoresist 290 is formed on the second dielectric layer 250 with the planarized BARC structure 280a. The second patterned photoresist 290 defines a second contact opening 300, a via opening in this case, as shown in FIG. 4E. The second patterned photoresist is formed on a planar surface so the critical dimension of features can be well controlled. Then, the planarized BARC layer 280a, the etch-stop layer 240, the first dielectric layer 230, and the nitride cap layer 220 are removed to expose the conductive structure 210 by using the second patterned photoresist 290 as a mask, as shown in FIG. 4F. Then, the second patterned photoresist 290 and the BARC layer 280b are removed. The second patterned photoresist 290 can be removed by a conventional technique such as ashing in an oxygen ($O_2$) plasma. The BARC layer 280b can be removed by either using an isotropic etch or a dry etch. Then, by filling the trench and via with conductive materials to form a conductive layer 310 the dual damascene interconnect structure is formed, as shown in FIG. 4G. The step of forming the conductive layer 310 comprises depositing a metal layer such that the metal layer is electrically continuous with the conductive structure 210 and planarizing the metal layer to expose the second dielectric layer 250. The conductive material can be a copper deposited to fill the openings. An optional barrier layer can also be deposited over the substrate to cover the bottom and sidewall of the openings prior to forming the conductive layer. The barrier layer serves as a diffusion barrier preventing materials in the conductive layer from diffusing into the dielectric layer. Thus, the profile distortion on via is improved and the CD control for via is also enhanced by patterning the via on a planar BARC surface with anti-reflective characteristic.

Although specific embodiments have been illustrated and described, it will be obvious to those skilled in the art that various modifications may be made without departing from what is intended to be limited solely by the appended claims.

What is claimed is:

1. A method for planarizing a bottom-anti-reflective layer, said method comprising:

providing a semiconductor structure having a substrate and a dielectric layer on said substrate, wherein said dielectric layer having an opening to expose a portion of said substrate;

filling said opening with a bottom-anti-reflective coating material to form said bottom-anti-reflective coating layer on said dielectric layer;

baking said bottom-anti-reflective coating layer at a first temperature, such that said bottom-anti-reflective coating layer is soft enough to be planarized;

planarizing said bottom-anti-reflective coating layer; and baking said bottom-anti-reflective coating layer at a second temperature to have anti-reflective ability.

2. The method according to claim 1, wherein said opening is a trench opening.

3. The method according to claim 1, wherein said step of forming said bottom-anti-reflective coating layer comprises forming said bottom-anti-reflective coating layer by spin-on technique.

4. The method according to claim 1, wherein said bottom-anti-reflective layer won't cross-link at said first temperature.

5. The method according to claim 4, wherein said first temperature is about 80° C. to 120° C.

6. The method according to claim 1, wherein said step of planarizing said bottom-anti-reflective coating layer comprises chemical mechanical polishing said bottom-anti-reflective coating layer.

7. The method according to claim 1, wherein said second temperature is about above 160° C.

8. A method for planarizing a bottom-anti-reflective layer, said method comprising:

provided a substrate;

forming a dielectric layer on said substrate;

forming a patterned photoresist on said dielectric layer, wherein said patterned photoresist defines an opening;

etching a portion of said dielectric layer to form said opening in said dielectric layer by using said patterned photoresist as a mask;

removing said patterned photoresist;

filling said opening with a bottom-anti-reflective coating material to form said bottom-anti-reflective coating layer on said dielectric layer;

baking said bottom-anti-reflective coating layer at a first temperature, wherein said bottom-anti-reflective coating layer won't cross-link at said first temperature;

planarizing said bottom-anti-reflective coating layer; and baking said bottom-anti-reflective coating layer at a second temperature to have anti-reflective ability.

9. The method according to claim 8, wherein said first temperature is about 80° C. to 120° C.

10. The method according to claim 8, wherein said step of planarizing said bottom-anti-reflective coating layer comprises chemical mechanical polishing said bottom-anti-reflective coating layer.

11. The method according to claim 8, wherein said second temperature is about above 160° C.

12. A method for forming a dual damascene interconnect structure, said method comprising:

providing a substrate having a conductive structure;

forming a first dielectric layer on said substrate;

forming an etch-stop layer on said first dielectric layer;

forming a second dielectric layer on said etch-stop layer;

forming a first patterned photoresist on said second dielectric layer, wherein said first patterned photoresist defines a first opening;

etching said second dielectric layer to expose said etch-stop layer by using said first patterned photoresist as a mask;

removing said first patterned photoresist;

filling said first opening with a bottom-anti-reflective coating material to form a bottom-anti-reflective coating layer on said second dielectric layer;

baking said bottom-anti-reflective coating layer at a first temperature, such that said bottom-anti-reflective coating layer is soft enough to be planarized;

planarizing said bottom-anti-reflective coating layer to expose said second dielectric layer;

baking said bottom-anti-reflective coating layer at a second temperature to have anti-reflective ability;

forming a second patterned photoresist on said second dielectric layer, wherein said second patterned photoresist defines a second opening;

etching said bottom-anti-reflective coating layer, said etch-stop layer, and said first dielectric layer to expose said conductive structure of said substrate by using said second patterned photoresist as a mask;

removing said second patterned photoresist;

removing said bottom-anti-reflective coating layer; and filling said first opening and said second opening with a conductive material to form a conductive layer.

13. The method according to claim 12, wherein said first opening is a trench opening.

14. The method according to claim 13, wherein said second opening is a via opening.

15. The method according to claim 12, wherein said step of forming said bottom-anti-reflective coating layer comprises forming said bottom-anti-reflective coating layer by spin-on technique.

16. The method according to claim 12, wherein said first temperature is about 80° C. to 120° C.

17. The method according to claim 12, wherein said step of planarizing said bottom-anti-reflective coating layer comprises chemical mechanical polishing said bottom-anti-reflective coating layer.

18. The method according to claim 12, wherein said second temperature is about above 160° C.

19. The method according to claim 12, wherein said step of forming said conductive layer comprises:

depositing a metal layer, such that said metal layer is electrically continuous with said conductive structure; and planarizing said metal layer to expose said second dielectric layer.

* * * * *